US011443921B2

(12) United States Patent
Fu et al.

(10) Patent No.: US 11,443,921 B2
(45) Date of Patent: Sep. 13, 2022

(54) RADIO FREQUENCY GROUND SYSTEM AND METHOD

(71) Applicant: Applied Materials, Inc., Santa Clara, CA (US)

(72) Inventors: Gaosheng Fu, San Jose, CA (US); Tuan Anh Nguyen, San Jose, CA (US); Amit Kumar Bansal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 97 days.

(21) Appl. No.: 16/898,650

(22) Filed: Jun. 11, 2020

(65) Prior Publication Data
US 2021/0391147 A1    Dec. 16, 2021

(51) Int. Cl.
*H01J 37/32* (2006.01)
*H05H 1/46* (2006.01)

(52) U.S. Cl.
CPC .. *H01J 37/32174* (2013.01); *H01J 37/32366* (2013.01); *H05H 1/46* (2013.01); *H01J 37/32091* (2013.01); *H05H 1/466* (2021.05)

(58) Field of Classification Search
None
See application file for complete search history.

(56) References Cited

U.S. PATENT DOCUMENTS

| | | | | |
|---|---|---|---|---|
| 7,972,470 B2* | 7/2011 | Furuta | ............... | H01J 37/32568 156/345.47 |
| 8,004,293 B2* | 8/2011 | White | ............... | H01J 37/32935 324/713 |
| 8,875,657 B2* | 11/2014 | Baek | ............... | C23C 16/505 118/723 E |
| 8,911,588 B2* | 12/2014 | Nam | ............... | C23C 16/505 156/345.28 |
| 9,096,926 B2* | 8/2015 | Hawrylchak | ....... | C23C 16/4585 |
| 9,123,511 B2* | 9/2015 | Young | ............... | H01J 37/32082 |
| 9,382,621 B2* | 7/2016 | Choi | ............... | C23C 16/4585 |
| 9,758,869 B2* | 9/2017 | Choi | ............... | H01J 37/32559 |
| 10,763,091 B2* | 9/2020 | Jindal | ............... | C23C 14/35 |
| 11,011,357 B2* | 5/2021 | Wu | ............... | H01J 37/3429 |

(Continued)

FOREIGN PATENT DOCUMENTS

| | | |
|---|---|---|
| CN | 102324367 B | 2/2016 |
| WO | 2010091205 A2 | 8/2010 |

OTHER PUBLICATIONS

International Search Report/ Written Opinion issued to PCT/US2021/032423 dated Sep. 2, 2021.

*Primary Examiner* — Srinivas Sathiraju
(74) *Attorney, Agent, or Firm* — Patterson + Sheridan, LLP

(57) ABSTRACT

The present disclosure provides an apparatus including a chamber body and a lid defining a volume therein. The apparatus includes a substrate support disposed in the volume opposite the lid. The substrate support includes a support body disposed on a stem, and a ground plate disposed between the support body and the stem. A top flange is coupled to a lower peripheral surface the ground plate and a bottom flange is coupled to a bottom of the chamber body. The bottom flange and the top flange is coupled to one another with a plurality of straps, each of the straps having a first end coupled to the bottom flange and a second end coupled to the top flange.

19 Claims, 6 Drawing Sheets

(56) References Cited

U.S. PATENT DOCUMENTS

| | | | | |
|---|---|---|---|---|
| 2006/0060302 A1* | 3/2006 | White | ............... | H01J 37/32082 |
| | | | | 156/345.28 |
| 2008/0116876 A1* | 5/2008 | White | ............... | H01L 21/67069 |
| | | | | 324/76.11 |
| 2008/0274297 A1* | 11/2008 | Furuta | ............... | H01J 37/32568 |
| | | | | 427/569 |
| 2010/0196626 A1* | 8/2010 | Choi | ................ | H01J 37/32091 |
| | | | | 427/569 |
| 2011/0146577 A1* | 6/2011 | Anwar | ............. | H01J 37/32541 |
| | | | | 118/723 R |
| 2013/0071581 A1* | 3/2013 | Baek | ................. | H01J 37/32091 |
| | | | | 427/569 |
| 2016/0305025 A1* | 10/2016 | Choi | ................ | H01J 37/32568 |
| 2017/0275759 A1* | 9/2017 | Kurita | ................. | C23C 16/4587 |
| 2018/0057935 A1* | 3/2018 | Budiarto | ........... | H01J 37/32853 |
| 2018/0340258 A1* | 11/2018 | Choi | ................. | C23C 16/45544 |
| 2018/0345330 A1* | 12/2018 | Zhai | ..................... | B08B 7/0035 |
| 2019/0043698 A1* | 2/2019 | Parkhe | ............. | H01J 37/32697 |
| 2021/0032748 A1* | 2/2021 | Bonecutter | ......... | C23C 16/4586 |
| 2021/0059037 A1* | 2/2021 | Ye | ..................... | H01J 37/32128 |
| 2021/0285101 A1* | 9/2021 | Franklin | ........... | H01L 21/67069 |
| 2021/0305020 A1* | 9/2021 | Subramani | ........ | H01J 37/32715 |

* cited by examiner

RADIO FREQUENCY GROUND SYSTEM AND METHOD

BACKGROUND

Field

Embodiments of the present disclosure generally relate to systems and methods of manufacturing a semiconductor device. More particularly, the present disclosure is directed to systems and methods of providing a radio frequency ground path.

Description of the Related Art

Plasma Enhanced CVD (PECVD) are processes used to deposit a film on a substrate, such as a semiconductor substrate. CVD is accomplished by introducing process gasses into a process chamber that contains the substrate. The process gasses are directed through a gas distribution assembly and into a process volume in the process chamber.

Radio frequency (RF) power is used to activate the process gasses in the process chamber to generate plasma. The RF power returns to the source. In some cases, arcing occurs from the RF power in the process chamber which damages the chamber and components thereof. A ground path is provided to direct the RF power away from components of the process chamber to prevent damage thereto and attempt to reduce an occurrence of arching in the process chamber. However, current ground path designs are complicated, expensive, high maintenance over time, and do not entirely address arcing in the process chamber.

Therefore, there is a need for a simple, less expensive, lower maintenance, and effective RF return path design.

SUMMARY

In some embodiments, an apparatus is provided including a chamber body and a lid defining a volume therein. The apparatus includes a substrate support disposed in the volume opposite the lid. The substrate support includes a support body disposed on a stem, and a ground plate disposed between the support body and the stem. A top flange is coupled to a lower peripheral surface of the ground plate and a bottom flange is coupled to a bottom of the chamber body. The bottom flange and the top flange are coupled to one another with a plurality of straps, each of the straps having a first end coupled to the bottom flange and a second end coupled to the top flange.

In some embodiments, a method of processing a substrate is provided including positioning a substrate on a substrate support in a volume of a processing chamber, the substrate support disposed in the volume opposite the lid. The substrate support includes a support body disposed on a stem, a ground plate disposed between the support body and the stem, and a top flange coupled to a lower peripheral surface the ground plate. The processing chamber includes a bottom flange coupled to a bottom of the chamber volume, and a plurality of straps, each of the straps having a first end coupled to the bottom flange and a second end coupled to the top flange. The substrate support is raised to a raised position forming an upper portion of the volume. The method includes introducing a gas to the upper portion of the volume, and activating the gas using radio frequency.

In some embodiments, a ground assembly is provided including a top flange having a top flange upper surface and a top flange lower surface. The ground assembly includes a bottom flange including a bottom flange upper surface and a bottom flange lower surface. The bottom flange has a lower portion extending radially inward from an inner diameter of the bottom flange and the lower portion has one or more apertures configured to receive screws. The ground assembly includes a plurality of straps, each of the straps comprising a first end coupled to the bottom flange and a second end coupled to the top flange.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only example embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments presented herein are directed to radio frequency (RF) grounding in process chambers. The process chamber includes a chamber body and a lid defining a volume therein. A substrate support is disposed in the volume opposite the lid and is coupled to a ground assembly.

The substrate support includes a support body disposed on a stem. The ground assembly is coupled to a ground plate that is disposed between the support body and the stem. A top flange is coupled to a lower peripheral surface of the ground plate, and a bottom flange is coupled to a bottom of the chamber body. The top flange and the bottom flange are coupled to one another by metal straps. Each of the straps is coupled to the bottom flange on a first end and to the top flange on a second end of each strap.

Figure 1:
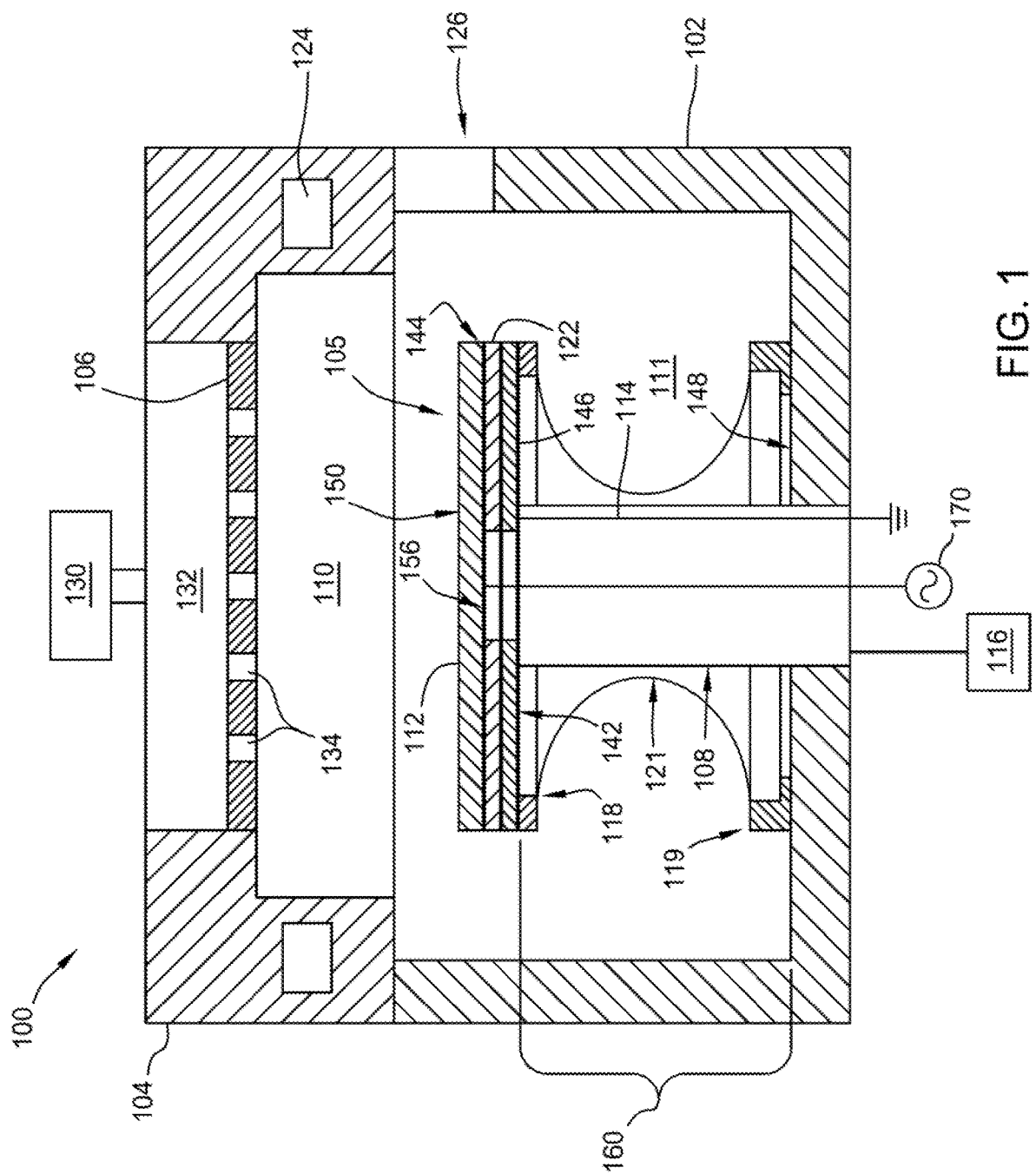
FIG. 1 depicts a schematic view of the processing chamber according to an example embodiment of the present disclosure.

FIG. 1 depicts a schematic view of the processing chamber 100 according to an example embodiment of the present disclosure. The process chamber 100 includes a chamber body 102 and a lid assembly 104 disposed on the chamber body 102. The chamber body 102 and the lid assembly 104 define an upper volume 110 and a lower volume 111 therein. A bottom 148 of the chamber body 102 faces the lid assembly 104. The lid assembly 104 includes a faceplate 106 with a plurality of holes 134 formed therethrough for supplying a gas from a gas source 130 which is coupled to the lid 104. A gas from the gas source 130 flows into a plenum 132 defined at least partially by the lid 104 and the faceplate 106. The plenum 132 is in fluid communication with the upper volume 110 via the plurality of holes 134. The plurality of holes 134 formed through the faceplate 106 enables a substantially uniform distribution of the gas into the upper volume 110. A power source 170, such as an RF power source is coupled to the substrate body 112 and is used to energize the gas from the gas source 130 within the upper volume 110.

A channel 124 is formed through the lid 104. The channel 124 surrounds at least a portion of the upper volume 110. The channel 124 is in fluid communication with an exhaust pump (not shown). The channel 124 enables gas and particles to be removed from the upper volume 110 to prevent damage to or contamination of a film deposited on the substrate. In some embodiments, it is contemplated that the channel 124 may instead before formed in a sidewall of the chamber body 102.

An opening 126 is formed through the chamber body 102 and enables a substrate to be loaded through the opening 126 onto a support surface 150 of a substrate support 105 (e.g., a pedestal). The support surface 150 is substantially parallel to and faces the lid assembly 104.

A substrate support 105 is disposed in the process chamber 100. The substrate support 105 includes a support body 112, an isolation plate 122, a ground plate 146, and a stem 108. The isolation plate 122 is positioned between the support body 112 and the ground plate 146, which together are disposed on the stem 108. The isolation plate 122 is fabricated from an electrically insulating material, such as a dielectric material or a ceramic, such as silicon oxide, or aluminum oxide to electrically isolate the substrate body 112 and the ground plate 146. The support body 112 may be a chuck, such as an electrostatic chuck or a vacuum chuck, and includes a bottom surface 156 that faces the bottom 148 of the chamber body 102. In some embodiments, which can be combined with other embodiments described herein, the support body 112 is a unitary member. The stem 108 extends laterally through the bottom 148 of the chamber body 102. The stem 108 is substantially normal to the bottom 148. The bottom 148 is substantially parallel to the faceplate 106. A conductive rod 114 is disposed in and extends through the stem 108 and is electrically coupled to the ground plate 146.

The ground plate 146 is coupled to a ground assembly 160. The ground assembly 160 is coupled to the support body 112 via the ground plate 146 and isolation plate 122. The ground plate 146 is fabricated from an electrically conductive material, for example a metal such as aluminum, and is coupled to the isolation plate 122. The isolation plate 122 is coupled to a bottom surface 156 of the support body 112. Alternatively, the ground plate 146 and the isolation plate 122 includes a central opening through which the stem 108 is disposed, allowing contact between the stem 108 and a central portion of the bottom surface 156. The support body divides the interior of the process chamber 100 includes an upper (or process) volume 110 and a lower volume 111. An actuator 116 moves the substrate support 105 between an upper or raised processing positioning and a lowered loading position.

The ground assembly 160, which includes the plurality of straps 121, physically and electrically couple the ground plate 146 to the bottom 148 of the chamber body. The ground assembly 160 includes a top flange 118, a bottom flange 119, and a plurality of straps 121, such as flexible straps, extending therebetween. An RF return path is provided from RF source 170, to the substrate body 112, travels through plasma in the upper volume 110, and back down along the chamber walls to the chamber bottom 148, to the ground plate 146, up the straps 121, to the top flange 118, to the ground plate 146 and to ground via the conductive rod 114.

The top flange 118 of the ground assembly 160 is disposed along the lower peripheral surface 142 of the ground plate 146, and is fastened or adhered thereto using fasteners, welding, brazing, or a conductive paste. The top flange 118 is disposed in a plane substantially parallel to the support surface 150. The top flange 118 extends along the lower surface 142 of the ground plate 146 to align with a radially outer surface 144 of the support body 112. The top flange 118 is ring shaped and is fabricated from a conductive material, such as a metal, such as aluminum or steel, such as stainless steel. The top flange 118 is electrically coupled to the bottom flange 119 via the plurality of straps 121. The top flange 118 is configured to move with the substrate support body 112 between the lowered position and the raised position as the actuator 116 lowers and raises the support body 112. During actuation, the straps 121 flex, for example inward, to accommodate the movement of the support body 112.

The bottom flange 119 is coupled the bottom 148 of the chamber body. The bottom flange 119 is a ring which is axially aligned with the top flange 118. The top flange has an outer diameter that is substantially equal to the outer diameter of the support surface 150 and is substantially equal to the outer diameter of the bottom flange 119. In one example, the bottom flange 119 and the top flange 118 have the same dimensions. The bottom flange 119 is fabricated from a conductive material, such as a metal, such as aluminum or stainless steel. The bottom flange 119 is fixed in position during movement of the support body 112. The bottom flange 119 facilitates flow of RF current away from the RF source. The RF current path is provided from RF source 170, to the substrate body 112, travels through plasma in the upper volume 110, and back down along the chamber walls to the chamber bottom 148, to the ground plate 146, up the straps 121, to the top flange 118, to the ground plate 146 and to ground via the conductive rod 114.

Figure 2A:
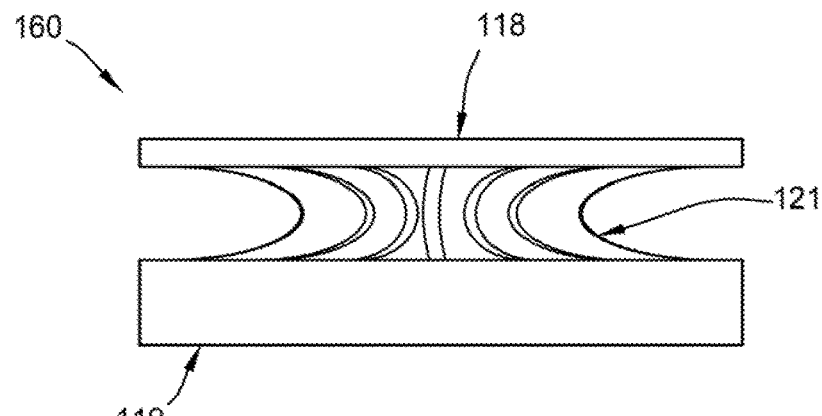
FIG. 2A depicts a ground assembly at a lowered position according to an example embodiment of the present disclosure.
Figure 2B:
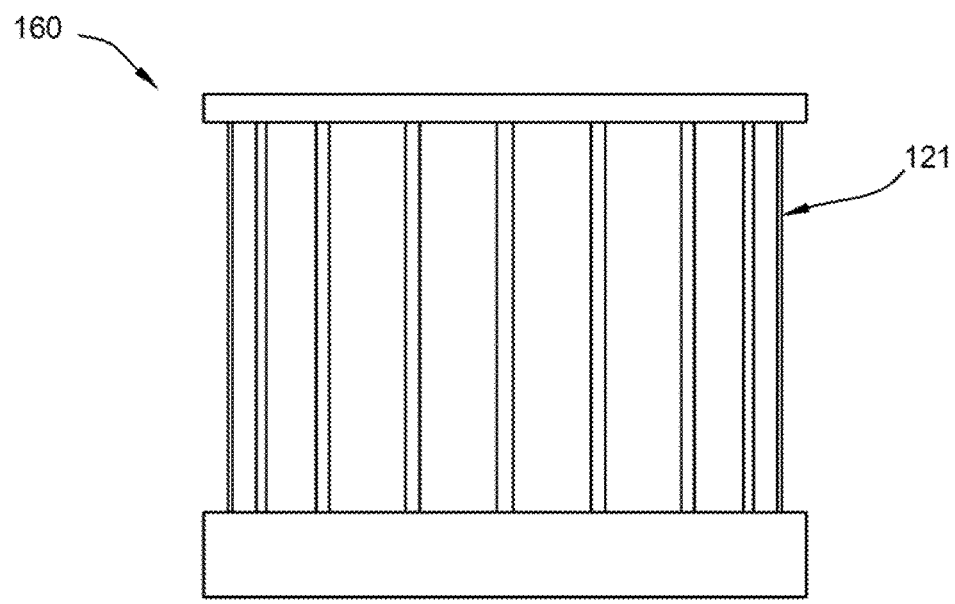
FIG. 2B depicts a ground assembly at a raised position according to an example embodiment of the present disclosure.

FIG. 2A depicts the ground assembly 160 in a lowered position, e.g., compressed position, and FIG. 2B depicts the ground assembly 160 at a raised position, e.g., extended position. At the lowered position, the straps 121 are compressed radially inward as depicted in FIG. 2A. At the raised position, the straps 121 are extended as depicted in FIG. 2B. In the lowered position, the gap between the bottom surface of the top flange 118 and the top surface of the bottom flange 119 is large enough to so that the screws on the top flange 118 do not contact the screws on the bottom flange 119.

Figure 2C:
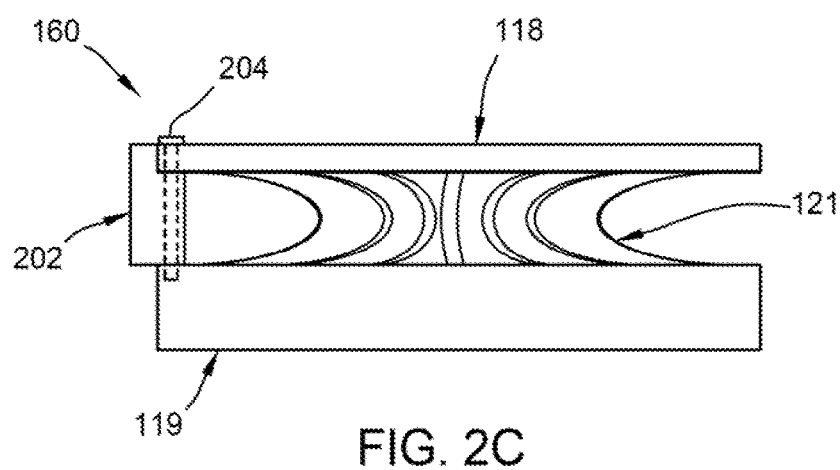
FIG. 2C depicts a ground assembly and jig prior to installation according to an example embodiment of the present disclosure.

FIG. 2C depicts a ground assembly 160 prior to installation of the ground assembly to a process chamber 100. The ground assembly 160 is in a compressed position and a jig 202 is disposed between the top flange 118 and the bottom flange 119. Although FIG. 2C depicts a single jig 202, there is one or more jigs 202 disposed between the top flange 118 and the bottom flange 119. In some embodiments, which can be combined with other embodiments described herein, there are about 1 to about 6 jigs, such as about 2 to about 4 jigs, such as about 3 jigs. The jigs 202 are secured in place between the top flange 118 and the bottom flange 119 by a screw 204, such as a stainless screw that runs from the top surface of the top flange 118, through the jig 202, and partially though the top part of the bottom flange 119. The screw 204 is removed and during installation, the ground assembly 160 is installed into the chamber with the jigs 202 in place. Once the top plate 118 is secured to the ground plate 146, the jigs 202 are removed from the side between the top flange 118 and the bottom flange 119.

Figure 3A:
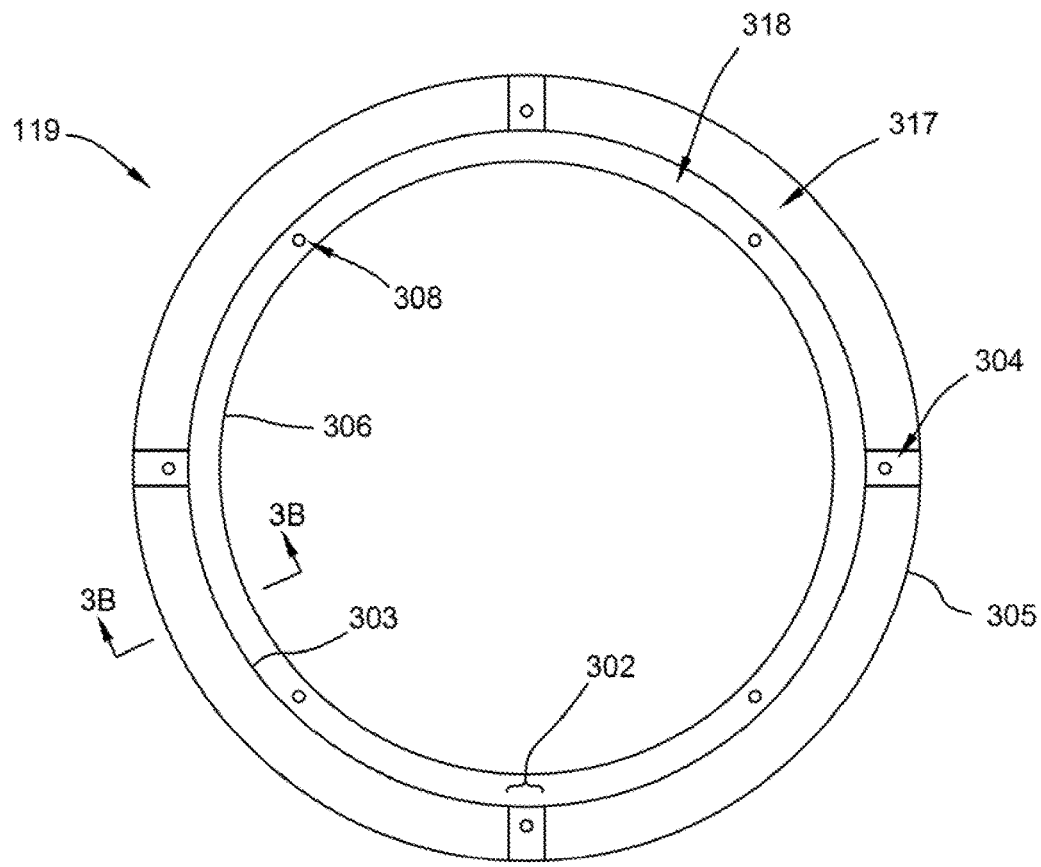
FIG. 3A depicts a top view of an example bottom flange of a ground assembly according to an example embodiment of the present disclosure.
Figure 3B:
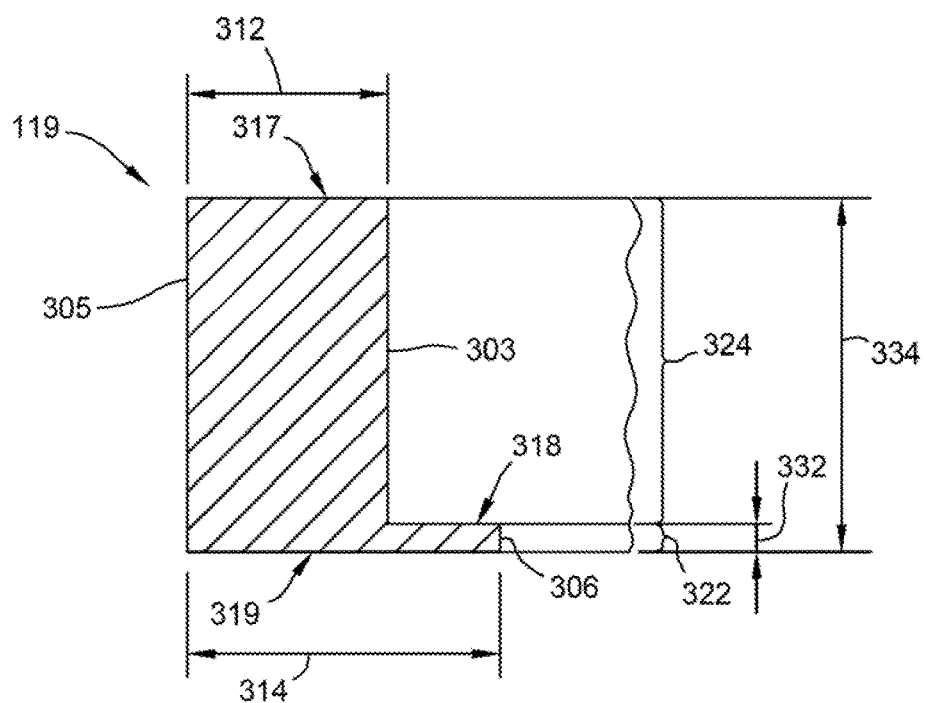
FIG. 3B depicts a cross-sectional view of the bottom flange according to an example embodiment of the present disclosure.

FIG. 3A depicts a top view of the bottom flange 119 showing a top surface 317 of the bottom flange 119 and FIG. 3B depicts an L-shaped cross-sectional view of the bottom flange 119. The bottom flange 119 is a ring with an L-shaped cross-section as shown in FIG. 3A and FIG. 3B. A first width 312 of the upper portion 324 of the bottom flange 119 including the top surface 317 is defined by an outer circumferential edge 305 and a first inner circumferential edge 303, each edge having surfaces which are concentrically aligned. The first width 312 is about 20 mm to about 30 mm, such as about 25 mm. A second width 314 of the lower portion 322 of the bottom flange 119 including the bottom surface 319 of the bottom flange 119 is defined by the outer circumferential edge 305 and a second inner circumferential edge 306, each edge having surfaces which are concentrically aligned. The second width 314 is about 30 mm to about 40 mm, such as about 35 mm. The second width 314 can be from about 5% to about 30% wider than the first width 312, such as about 5% to about 25%, such as about 10% to about 20%.

The lower portion 322 of the bottom flange 119 has a first surface (e.g., the bottom surface 319 of the bottom flange) and a second surface 318, the second surface 318 is positioned parallel to the first surface 319 of the lower portion 322 of the bottom flange 119. A height 332 of the lower portion 322 of the bottom flange 119 is a distance between the first surface 319 and the second surface 318 of the lower portion 322 of bottom flange 119. The height 332 of the lower portion 322 of the bottom flange 119 is about 4 mm to about 6 mm, such as about 4 to about 5 mm. A total height 334 of the bottom flange 119 is a distance between the first surface 319 and the top surface 317 of the bottom flange 119. The total height 334 of the bottom flange 119 is about 20 mm to about 50 mm, such as about 30 mm to about 45 mm, such as about 43 mm. The height 332 of the lower portion 322 is about 2% to about 30% of the total height 334 of the bottom flange 119, such as about 4% to about 20%, such as about 5% to 15%. The height 332 of the bottom flange 119 is selected based on space available in the chamber to install the grounding assembly 160, such as to allow removal of the jigs 202. The outer diameter of the bottom flange 119 is sized to be substantially the same as the outer diameter of the substrate body 112 and the outer diameter of the top flange 118. In some embodiments, which can be combined with other embodiments described herein, the outer diameter of one or both of the bottom flange 119 and the top flange 118 is about 300 mm to about 400 mm, such as about 350 mm to about 370 mm.

The second surface 318 of the lower portion 322 of the bottom flange 119 includes a plurality of apertures 308 (four are shown) disposed therethrough. The plurality of apertures 308 are configured to receive fasteners 416 (FIG. 4B) to couple the bottom flange 119 to the bottom 148 of the chamber body. In one example, each aperture 308 of the plurality of apertures 308 are equally spaced an angular distance from one another. For example, when utilizing four apertures 308, the apertures 308 are spaced about 90 degrees from one another. In some embodiments, which can be combined with other embodiments described herein, the angular spacing between each of the apertures 308 about the bottom flange is from about 18 degrees to about 36 degrees, such as about to about 30 degrees. The apertures 308 are arranged to be staggered with one or more lift pin standoffs such that the straps 121 do not make physical contact with the lift pin standoffs. The apertures 308 are arranged to be staggered with a current provision hole in the chamber.

Figure 4A:
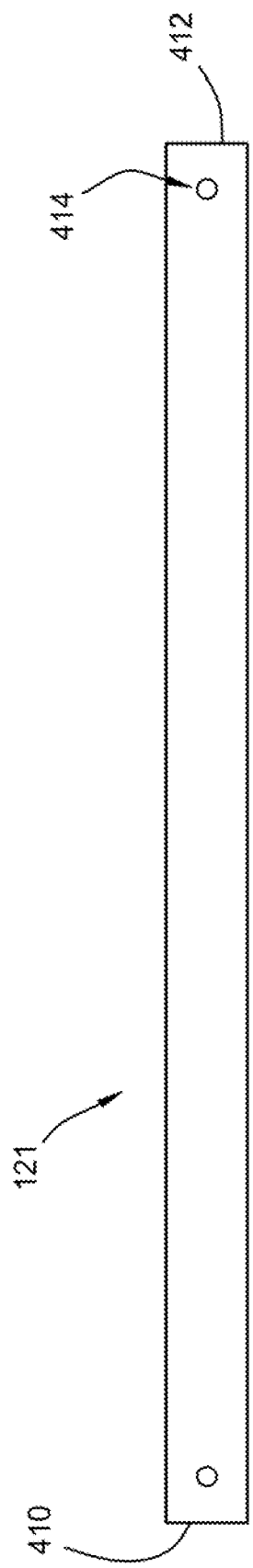
FIG. 4A depicts a top view of an example strap of a ground assembly according to an example embodiment of the present disclosure.
Figure 4B:
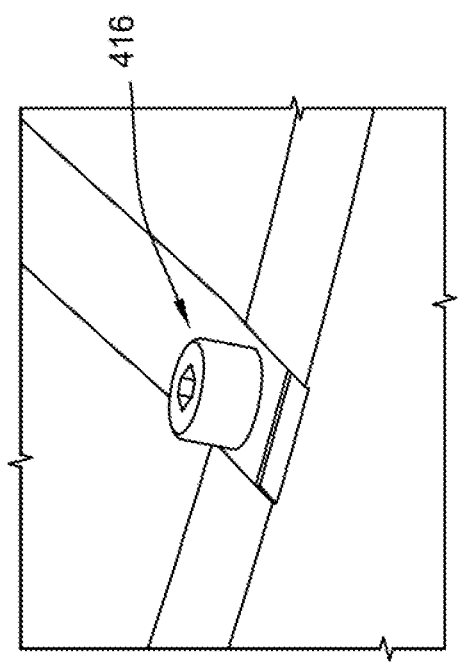
FIG. 4B depicts an end of a strap secured in a bottom flange of a ground assembly according to an example embodiment of the present disclosure.

The top surface 317 of the bottom flange 119 includes a plurality of recesses 302 formed therein. Each recess 302 extends from an outer edge 305 to a radially inward edge 303 of the upper portion 324 of the bottom flange 119. The distance from the inward edge 303 to the outer edge 305 is about 20 mm to about 30 mm, such as about 25 mm. Each recess 302 is configured to receive a first end 410 (see FIG. 4) of each strap 121, and may extend to a depth equal to a thickness of each strap 121. An example strap 121 is depicted in FIG. 4A. The strap 121 includes a first end 410, a second end 412, and at least one aperture 414 disposed at each of the first and second ends 410, 412. During installation, the first end 410 is positioned within a recess 302 at the top surface 317 of the bottom flange 119. The aperture 414 is aligned with an aperture 304 formed within the recess 302. The first end 410 of the strap 121 is secured within the recess 302 with a fastener 416, as shown in FIG. 4B. In some embodiments, which can be combined with other embodiments described herein, the first end 410 of the strap 121 is secured to the top surface 317 of the bottom flange 119 by welding or brazing. Each recess 302 is angularly offset from the apertures 308, resulting in the apertures 304 also being angularly offset from the apertures 308. In one example, each recess 302 is angularly equidistant from adjacent apertures 308. Although the number of apertures 304 is equal to the number of apertures 308 in FIG. 3A, it is contemplated that the number of apertures 304 may be greater than or less than the number of apertures 308.

Figure 5A:
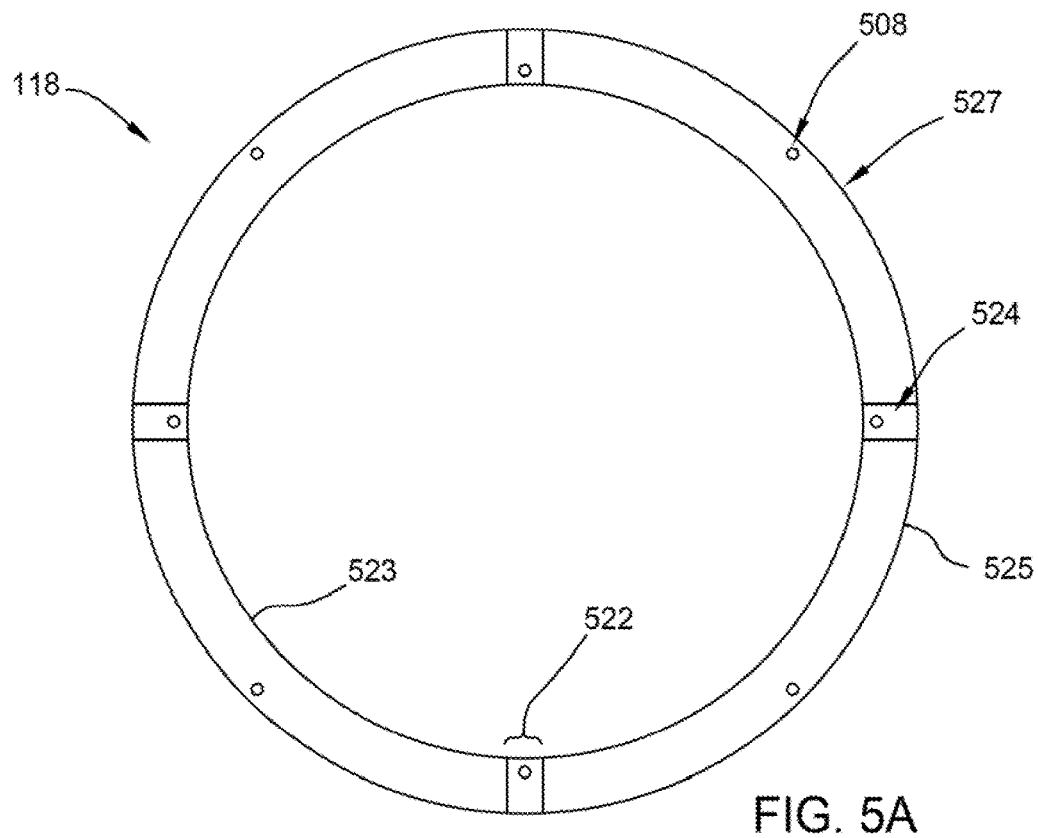
FIG. 5A depicts a bottom view of an example top flange of a ground assembly according to an example embodiment of the present disclosure.

FIG. 5A depicts a bottom view of the top flange 118 showing a bottom surface 527 of the top flange 118. The bottom surface 527 of the top flange 118 is defined by an outer circumferential edge 525 and an inner circumferential edge 523, each edge having surfaces which are concentrically aligned. The distance from the outer circumferential edge 525 to the inner circumferential edge 523 is about 15 mm to about 30 mm, such as about 20 mm to about 25 mm. A plurality of recesses 522 is disposed on a bottom surface 527 of the top flange 118. The recesses 522 on the bottom surface 527 of the top flange 118 is aligned with the recesses 302 on the top surface 317 of the bottom flange 119. The second end 412 (shown in FIG. 4A) of the strap 121 is coupled to the bottom surface 527 of the top flange 118 in substantially the same way as the first end 410 is secured to the top surface 317 of the bottom flange 119. In particular, the strap 121 is secured by positioning the second end 412 within the recess 522 disposed on the top flange 118, aligning the aperture 524 of the second end 412 of the strap 121 with an aperture 524 disposed within the recess 522 of the bottom surface 527 of the top flange 118, and securing the second end of the strap 121 with a fastener 416. In some embodiments, which can be combined with other embodiments described herein, the second end 412 of the strap 121 is secured to the bottom surface 527 of the top flange 118 by welding or brazing.

The bottom surface 527 of the top flange 118 includes a plurality of apertures 508 (four are shown) disposed therethrough. The plurality of apertures 508 are configured to receive fasteners 416 to couple the top flange 118 to the ground plate 142. Additionally, at least one of the plurality of apertures 508 are used to secure the jig 202 to the top flange using screw 204. In some embodiments, which can be combined with other embodiments disclosed herein, each aperture 508 of the plurality of apertures 508 are equally spaced in an angular distance from one another. In some embodiments, which can be combined with other embodiments disclosed herein, each recess 522 is angularly equidistant from adjacent apertures 508. Although the number of apertures 524 is equal to the number of apertures 508 in FIG. 5A, it is contemplated that the number of apertures 524 may be greater than or less than the number of apertures 508. Although FIG. 3A and FIG. 5A each depict four recesses (e.g., 302, 522), an example ground assembly 160 can have four or more straps 121, such as about 10 to about 20, such as about 10 to about 16, such as about 12.

Figure 5B:
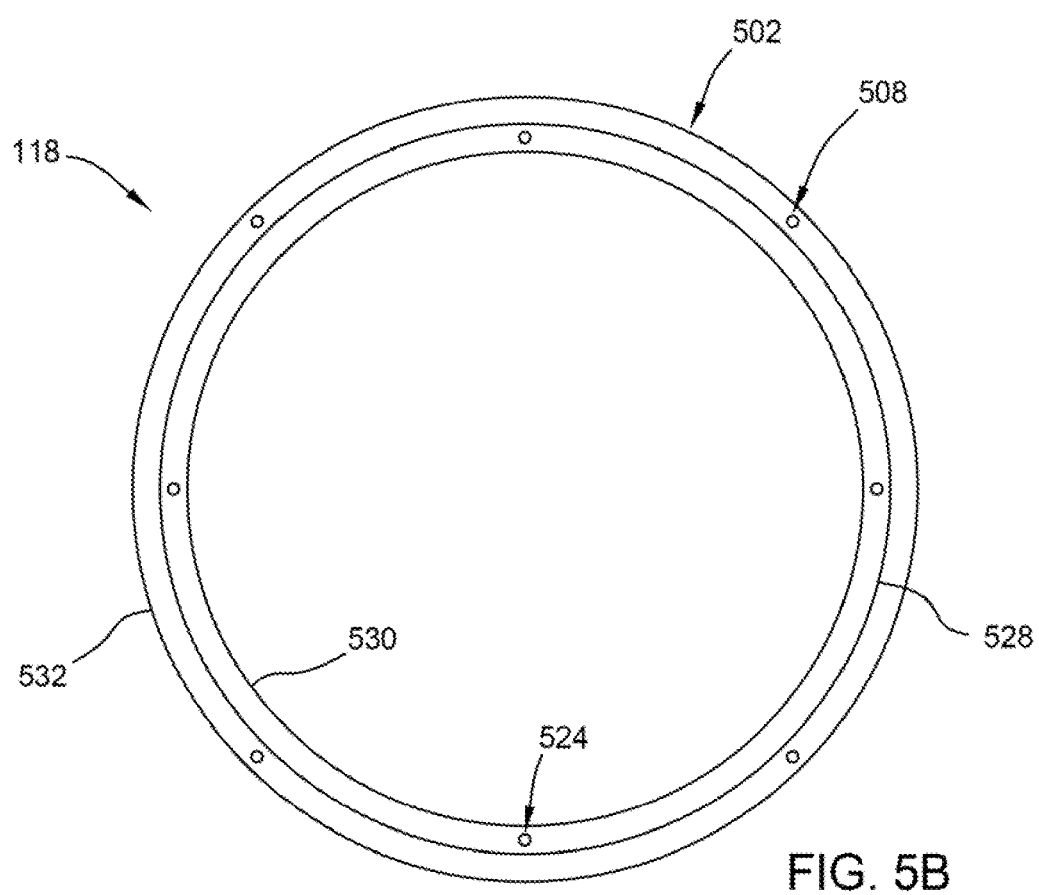
FIG. 5B depicts a top view of an example top flange of a ground assembly according to an example embodiment of the present disclosure.

FIG. 5B depicts a top view of the top flange 118 showing a top surface 502 of the top flange 118. The top surface 502 of the top flange 118 includes a channel 528 disposed about the top surface 502 separating an outer portion 532 of the top flange 118 and an inner portion 530 of the top flange 118. The channel 528 is configured to receive a gasket, such as a stainless steel gasket, to seal the top flange 118 to the ground plate 142. Sealing the top flange 118 prevents RF current from leaking in the lower volume 111. The plurality of apertures 508 is disposed about the outer portion 532 and the plurality of apertures 524 is disposed about the inner portion 530. The apertures 524 are configured to receive straps 121.

The fasteners 416 are any suitable screw, such as high nickel content stainless steel screws. The screws are made from a conductive material, such as an alloy, such as steel. In some embodiments, which can be combined with other embodiments disclosed herein, the screws are free of copper. The straps 121 are made from a conductive material, such as an alloy, such as steel. The material of the straps 121 includes carbon, chromium, nickel, manganese, silicon, nitrogen, phosphorus, sulfur, stainless steel, Inconel material, alloys thereof, or combinations thereof. The plurality of straps 121 are symmetrically disposed about each of the top flange and the bottom flange to provide a symmetric RF return path in the process chamber, as depicted in the ground assembly 160. It has been discovered that if the straps 121 are not adequately symmetric, process uniformity and device quality is affected. In some embodiments, which can be combined with other embodiments described herein, the angular spacing between each of the plurality of straps 121 about the bottom flange is from about 18 degrees to about 36 degrees, such as about to about 30 degrees. In some embodiments, which can be combined with other embodiments described herein, the angular spacing between two adjacent straps 121 varies by less than 5% with respect to the remaining adjacent straps 121. The straps 121 are arranged to be staggered with one or more lift pin standoffs such that the straps 121 do not make physical contact with the lift pin standoffs.

The thickness of each strap 121 is about 0.12 mm to about 0.30 mm, such as about 0.15 mm to about 0.2 mm. The length of the strap 121 is about 180 mm to about 195 mm, such as about 180 mm to about 190 mm, such as about 195 mm. The width of the strap 121 is about 8 mm to about 15 mm, such as about 9 mm to about 11 mm, such as about 10 mm. The strap 121 has a spring constant of greater than about 17 lb/in, such about 17 lb/in to about 20 lb/in, such as about 18 lb/in to about 19 lb/in, such as about 18.4 lb/in to about 18.8 lb/in. Each strap is composed of stainless steel such as SS302 or Inconel material. In some embodiments, which can be combined with other embodiments described herein, the material of the strap is any material that provides sufficient spring constant and corrosion resistance. In some embodiments, which can be combined with other embodiments described herein, the strap is mechanically cycled by bending the strap from about 200,000 to 2 million times without evidence of mechanical failure.

The ground assembly 160 as used herein is used during numerous runs without changing out the straps 121. In contrast, previous ground assemblies are typically regularly replaced or maintained because of loss in the spring constant overtime. These ground assemblies include a design with a ground component that is only coupled to a ground plate at all times during processing. Moreover, the ground component only makes contact with a seal of the substrate lid when the substrate body 112 is in a raised position during processing. During processing with these conventional grounding assemblies, the substrate body 112 raised and lowered repeatedly which relies on multiple compression and expansion of the ground component. Multiple compression and expansion of the ground component leads to a reduction in elasticity or spring constant overtime due to overuse and the ground component is routinely replaced. In contrast, the ground assembly 160 described herein is coupled to the ground plate at all times during operation and to the bottom of the chamber at all times. Thus, raising and lowering the substrate body 112 does not reduce the contact of the ground assembly 160 to the chamber body. Moreover, since the straps 121 of the present disclosure are fastened at each end to the top flange 118 and the bottom flange 119, the straps 121 are not reliant on an inherit spring constant to return to form. Rather, actuation of the substrate support 105 returns the straps 121 to a desired position. Thus, issues with degradation of spring constant, which is troublesome in conventional approaches, is addressed by the present disclosure.

Figure 6:
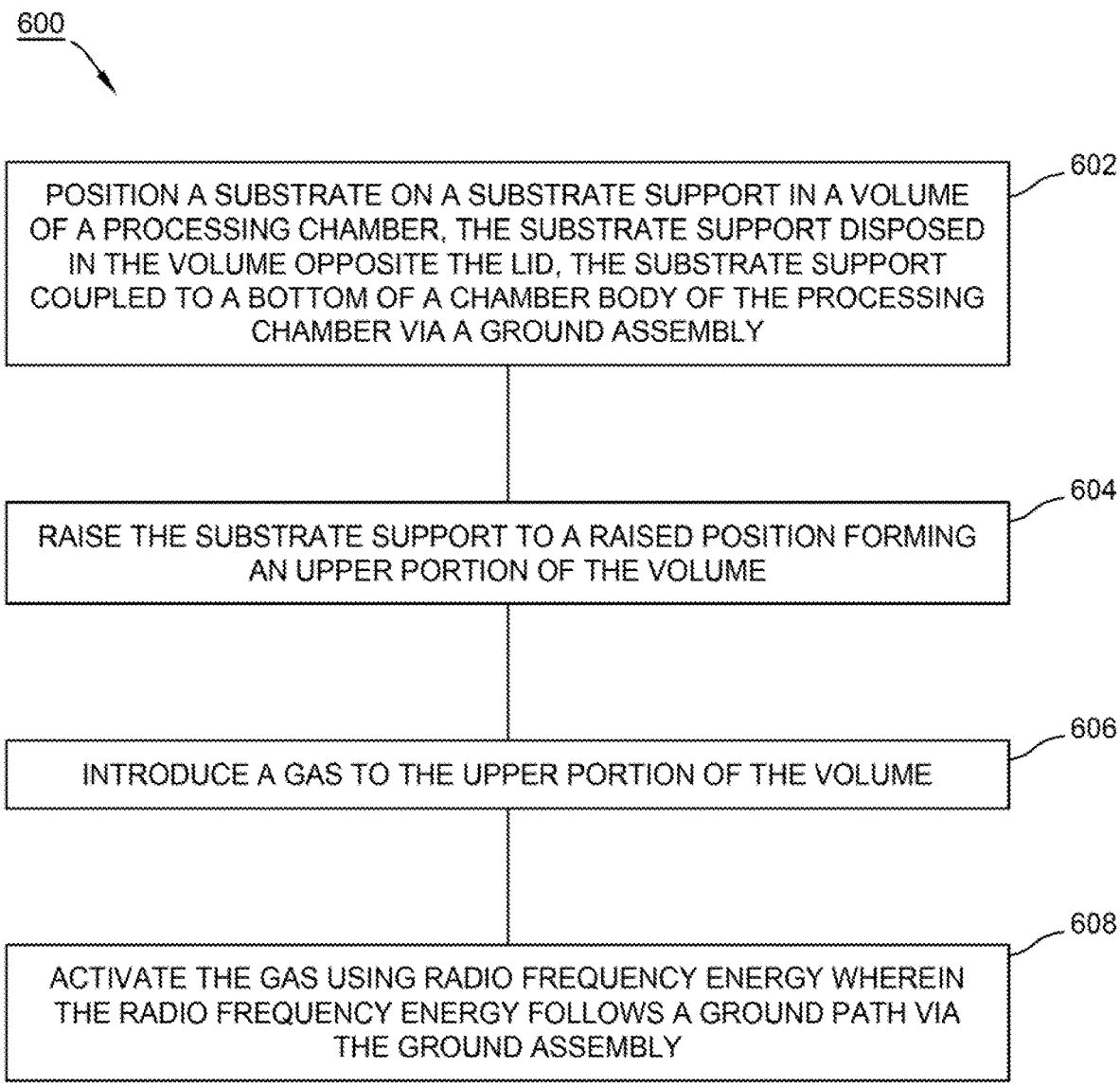
FIG. 6 depicts a flow diagram of an example method of processing a substrate according to an example embodiment of the present disclosure.

FIG. 6 depicts a flow diagram of an example method 600 of processing a substrate according to an example embodiment of the present disclosure. In operation 602, a substrate is positioned on a substrate support 105 in the upper volume 110 of the processing chamber 100. The substrate is loaded through an opening 126 that is formed through the chamber body 102 and onto a support surface 150 of a substrate support 105 (e.g., a pedestal). The substrate support 105 is coupled to an example ground assembly 160 via ground plate 146 described herein. Positioning the substrate on the substrate support includes positioning the substrate on the support body 112.

In operation 604 of method 600, the substrate support is raised using actuator 116 to a raised position. The substrate support is raised using the actuator 116. The ground assembly 160 described herein enables the substrate support to be coupled to the bottom surface 148 of the chamber body at the raised position and at the lower position. Thus, a grounding path is maintained at all times during operation and for a variety of different processes performed at variable substrate support positions (e.g., different substrate support heights). Processes described herein include operating conditions with a larger gap between the top and bottom flange. Ground assemblies known in the art provide grounding for processes with a fixed gap, such as a narrow gap between the substrate body 112 and the bottom surface 148 of the chamber. The ground assemblies described herein provides grounding paths at all times during operation for a number of different processes with different gaps between the substrate body 112 and the bottom surface 148 of the chamber. The constant grounding for different gaps between the substrate body 112 and the bottom surface 148 of the chamber allows for a wide process window. In some embodiments, which can be combined with other embodiments described herein, the gap between the substrate body 112 and the bottom surface 148 of the chamber from about 6 mm to about 51 mm. The constant grounding as described in the present disclosure enables stable processing, such as during deposition of films, alternatively or additionally, during plasma cleaning of the chamber. Constant grounding as described in the present disclosure will reduce the risk of any asymmetric parasitic plasma created due to loose grounding contact. Ground strap designs known in the art rely on spring constant to make full contact with a ground path which is not reliable and is uses frequent preventative maintenance. It is possible to secure ground straps to one or more sides of the chamber. However, such arrangements are limited in the gap size between the substrate body 112 and the bottom surface 148 of the bottom chamber.

In operation 606, a gas is introduced to the upper volume 110. The gas is supplied from a gas source 130 that is coupled to the lid 104 and is introduced into the upper volume 110 from the gas source 130 through the faceplate 106.

In operation 608, the gas is activated using electromagnetic energy such as radio frequency energy, and generates plasma via capacitive coupling. The activated gas is used to deposit material on the substrate. The radio frequency follows an RF path from the substrate support, through the plasma in the upper volume 110, to the bottom of the chamber body, to the ground plate 146 via the ground assembly 160 and to ground via conductive rod 114. The RF return path substantially reduces an occurrence of RF leakage, formation of parasitic plasma, and arcing within the volumes 110 and 111, by providing a preferred path for RF travel. The term "parasitic plasma" as used herein, refers to plasma in volumes outside of the upper volume 110. In particular, plasma found in a lower volume 111 of the volume is considered "parasitic plasma." In some embodiments, which can be combined with other embodiments disclosed herein, the lower volume 111 includes a voltage within the gas of the lower volume 111 of less than 100 V. The voltage of less than 100 V within the gas of the lower volume 111 demonstrates that RF leakage into the lower volume 111 is minimized due to the grounding assembly 160 disclosed herein. The ground assembly 160 reduces the voltage of the gas within the lower volume 111 by providing an RF path from the substrate support 105 to ground and preventing RF leakage into the lower volume 111. The ground assembly 160 of the present disclosure is useful for processing a substrate in a plasma enhance chemical vapor deposition, etch process, or any process that uses an RF source provided to the bottom surface 156 of the substrate body 112.

Certain features, structures, compositions, materials, or characteristics described herein is combined in any suitable manner in one or more embodiments. Although the present disclosure herein has been described with reference to particular embodiments, it is to be understood that these embodiments are merely illustrative of the principles and applications of the present disclosure. It will be apparent to those skilled in the art that various modifications and variations can be made to the method and systems of the present disclosure. Thus it is intended that the present disclosure include modifications and variations that are within the scope of the appended claims and their equivalents.

The invention claimed is:

1. An apparatus, comprising:
 a chamber body and a lid defining a volume therein;
 a substrate support disposed in the volume opposite the lid, the substrate support comprising:
  a support body disposed on a stem, the support body configured to be coupled to a radiofrequency source fed through the stem, and
 a ground plate coupled to ground and disposed between the support body and the stem and
 an isolation plate disposed between the support body and the ground plate, the isolation plate at least partially providing electrical isolation between the support body and the ground plate;
 a circular top flange coupled to a lower peripheral surface the ground plate, wherein the top flange comprises a central opening disposed therethrough for providing access for a radio frequency supply feedthrough;
 a circular bottom flange coupled to a bottom of the chamber body; and
 a plurality of straps, each of the straps comprising a first end coupled to the circular bottom flange and a second end coupled to the circular top flange, the plurality of straps providing an RF path from the bottom of the chamber body to the ground plate to ground.

2. The apparatus of claim 1, wherein the plurality of straps comprises 10 to 20 straps.

3. The apparatus of claim 1, wherein each of the plurality of straps is composed of a metal comprising stainless steel, inconel, carbon, chromium, nickel, manganese, silicon, nitrogen, phosphorus, sulfur, or combinations thereof.

4. The apparatus of claim 1, wherein the first end of each of the plurality of straps is coupled to a recessed portion of a top surface of the circular bottom flange using screws and the second end of each strap is coupled to a recessed portion of a bottom surface of the top flange using screws.

5. The apparatus of claim 1, wherein the circular top flange comprises a metal comprising steel, aluminum, alloys thereof, or combinations thereof.

6. The apparatus of claim 1, wherein the bottom flange is coupled to the circular bottom of the chamber using a plurality of stainless steel fasteners.

7. The apparatus of claim 1, wherein each of the plurality of straps are configured to bend radially inward when the substrate support is in a retracted position.

8. The apparatus of claim 1, wherein each strap comprises a spring constant of from 17 lb/in to about 20 lb/in.

9. The apparatus of claim 1, wherein a minimum distance between the circular top and circular bottom flanges is greater than 6 mm.

10. The apparatus of claim 1, further comprising a conductive rod configured to couple to ground and extending through the stem capable of providing an RF path from the ground plate to ground.

11. A method of processing a substrate, comprising:
positioning a substrate on a substrate support in a volume formed by a chamber wall, a lid, and a bottom of a processing chamber, the substrate support disposed in the volume opposite the lid, the substrate support comprising a support body disposed on a stem, a ground plate disposed between the support body and the stem, an isolation plate disposed between the support body and the ground plate, the isolation plate at least partially providing electrical isolation between the support body and the ground plate, and a circular top flange coupled to a lower peripheral surface the ground plate, the processing chamber comprising a circular bottom flange coupled to the bottom of the chamber, and a plurality of straps, each of the straps comprising a first end coupled to the circular bottom flange and a second end coupled to the circular top flange;
raising the substrate support to a raised position forming an upper portion of the volume;
introducing a gas to the upper portion of the volume; and
activating the gas using radio frequency energy supplied to the substrate body, the radio frequency energy flowing from the substrate body, to the activated gas in the volume of the process chamber to the bottom of the chamber, up the plurality of straps to the ground plate, wherein the circular bottom flange comprises a central opening disposed therethrough for providing access for a radio frequency supply feedthrough.

12. The method of claim 11, wherein the lower portion of the volume is substantially free of plasma.

13. The method of claim 11, comprising processing the substrate in a plasma enhanced chemical vapor deposition, or etch process.

14. The method of claim 11, wherein raising the substrate support to a raised position comprises raising the ground plate and maintaining a radio frequency path from the circular bottom flange to the ground plate through at least one of the plurality of straps.

15. A system comprising an algorithm stored in a memory of the system, wherein the algorithm comprises a number of instructions which, when executed by a processor, causes the method of claim 11 to be performed.

16. An apparatus, comprising:
a circular top flange comprising a top flange upper surface and a top flange lower surface;
a circular bottom flange comprising a bottom flange upper surface and a bottom flange lower surface, the circular bottom flange comprising a lower portion extending radially inward from an inner diameter of the circular bottom flange, the lower portion comprising one or more apertures configured to receive screws; and
a plurality of straps, each of the straps comprising a first end coupled to the circular bottom flange and a second end coupled to the circular top flange, each of the plurality of straps positioned symmetrically about the circular top flange and capable of flexing radially inward to a center of the circular top flange, wherein each strap comprises a spring constant of from 17 lb/in to about 20 lb/in.

17. The apparatus of claim 16, wherein the circular top flange lower surface comprises recesses configured to receive the first end of each of the plurality of straps and the circular bottom flange upper surface comprises recesses configured to receive the second end of each of the plurality of straps.

18. The apparatus of claim 16, wherein the circular top flange comprises a central opening disposed therethrough for providing access for a radio frequency supply feedthrough.

19. The apparatus of claim 16, wherein the circular bottom flange comprises a central opening disposed therethrough for providing access for a radio frequency supply feedthrough.

* * * * *